United States Patent [19]

Sato et al.

[11] Patent Number: 4,600,965

[45] Date of Patent: Jul. 15, 1986

[54] CURRENT DRIVING CIRCUIT

[75] Inventors: Naoki Sato, Hachioji; Yoshihisa Kamo, Kokubunji; Yasuhiro Katoh, Nishitama; Kazuhiro Momata, Chigasaki; Shinichi Arai, Odawara, all of Japan

[73] Assignee: Hitachi, Ltd., Tokyo, Japan

[21] Appl. No.: 580,711

[22] Filed: Feb. 16, 1984

[30] Foreign Application Priority Data

Feb. 23, 1983 [JP] Japan .................................. 58-28967

[51] Int. Cl.[4] .......................... G05F 3/22; H01H 47/32
[52] U.S. Cl. ................................... 361/153; 323/316; 361/152
[58] Field of Search ................ 361/152, 153; 323/315, 323/316

[56] References Cited

U.S. PATENT DOCUMENTS 3,629,725 12/1971 Chun ................................. 363/55 X
4,433,357 2/1984 Nishimura et al. ............. 361/153 X
4,513,252 4/1985 Sano ................................. 323/316 X Primary Examiner—Michael L. Gellner
Attorney, Agent, or Firm—Antonelli, Terry & Wands

[57] ABSTRACT

In a current driving circuit which supplies a two-terminal load with current to be inverted in accordance with input information, a current driving circuit according to the present invention comprises a load whose one-side terminal has its potential fixed, circuitry to supply a non-fixed side terminal of the load with a direct current, and circuitry to supply the non-fixed side terminal with a current having a magnitude double that of the direct current and a polarity opposite to that of the direct current, while switching it in accordance with input information. Owing to such construction, the number of terminals to be led out from the loads can be reduced, and a load current can be inverted at high speed. In addition, reliability can be enhanced because the assembling process is simplified.

17 Claims, 9 Drawing Figures

FIG. 1(a)
FIG. 1(b)
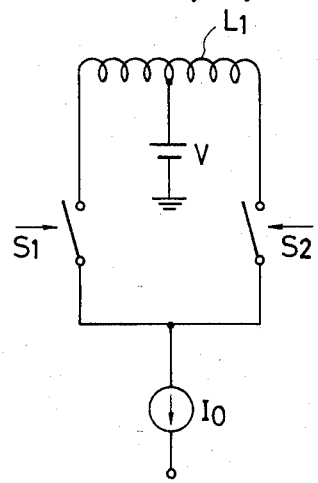
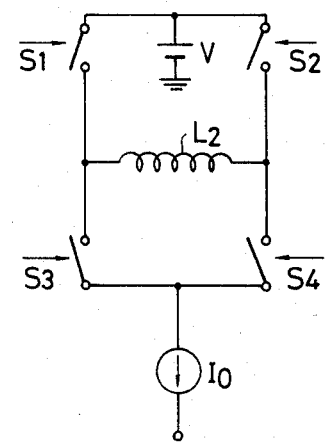
FIG. 2
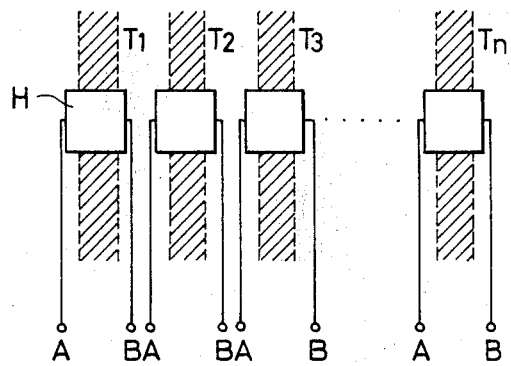

FIG. 3
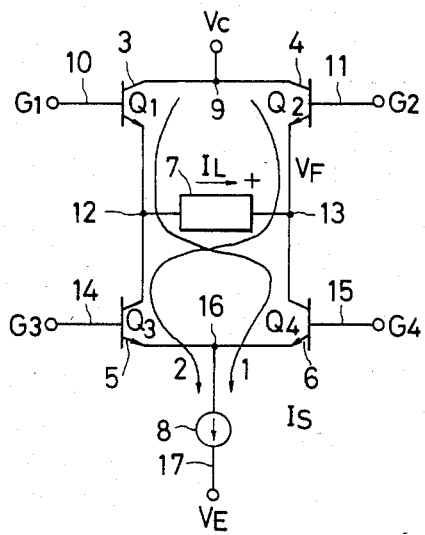
FIG. 4
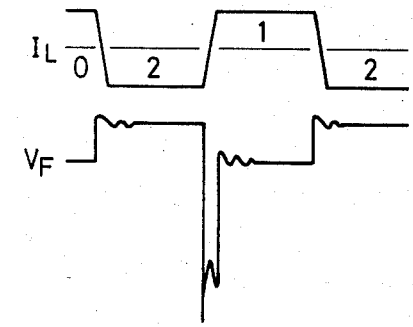
FIG. 5
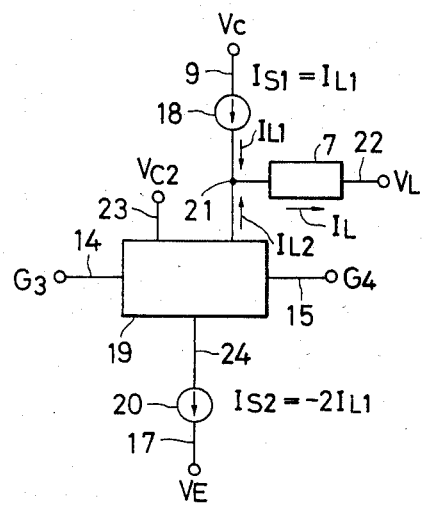
FIG. 6
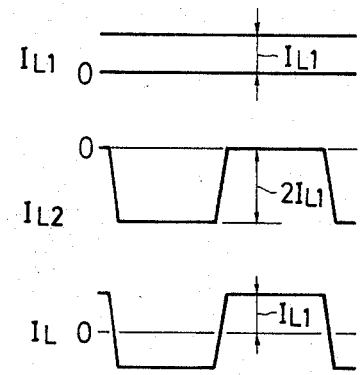

CURRENT DRIVING CIRCUIT

BACKGROUND OF THE INVENTION

The present invention relates to current driving circuits, and more particularly to a current driving circuit which can change the recording currents of the magnetic heads of a magnetic tape storage device etc. at high speed.

The recording method of a magnetic tape storage device, a magnetic disk file storage device, etc. utilizes the magnetic storage phenomenon of a ferromagnetic substance. A coil is wound on an annular core, and current is caused to flow therethrough, to generate in the core a magnetic flux conforming to the direction of the current, so that the magnetic flux leaks from a gap provided in the core and magnetizes the surface of the magnetic substance. Since the magnetic flux in the core is inverted by changing the sense of the current, the surface of the magnetic substance is magnetized in the reverse direction by the leakage flux. In this case, when the sense of the current to flow through the coil is changed, a voltage reacting against the change (hereinbelow, termed "flyback voltage") is generated. As the changing speed becomes higher, the flyback voltage increases in amplitude. The high speed operation of the current driving circuit of the magnetic head is therefore difficult. In the typical magnetic tape storage device, the width of a track is about 1 mm, the geometries of the core are large and the inductance (L) of the head is high, so that the flybck voltage becomes very great. For such a head, there has heretofore been a circuit for three terminals wherein, as shown in FIG. 1(a), a coil $L_1$ is provided with a center tap to which a supply voltage V is connected, and switches $S_1$ and $S_2$ at both the ends of the coil $L_1$ are alternately turned "on" and "off", whereby the sense of the recording current to flow through the coil $L_1$ is changed. With this arrangement, the two switches $S_1$ and $S_2$ suffice as the switches for the change-over control. However, thin film heads have been developed in recent years, and it is deemed very difficult to provide the center tap in a method of manufacturing the thin film head. Accordingly, a circuit shown in FIG. 1(b) (refer to, for example, 'IBM Technical Disclosure Bulletin', Vol. 23, No. 11, April 1981, pp. 5167-5168) is employed for the thin film head. With this circuit, as stated before, the high-speed current changing is difficult when the flyback voltage becomes great. Further, when multitrack recording is also taken into consideration, two terminals (A, B) are necessary for each track as shown in FIG. 2 in spite of narrowed track pitches, so that the connection and packaging of the heads (H) and circuits become very difficult. In FIG. 1(b), current is caused to flow from the left to the right of a coil $L_2$ by turning "on" switches $S_1$ and $S_4$ and turning "off" switches $S_2$ and $S_3$, while in inverting the direction of the current, the switches $S_1$ and $S_4$ need to be turned "off" and those $S_2$ and $S_3$ "on". Therefore, it is necessary to provide the four switches shown.

FIG. 3 is a diagram of the fundamental arrangement of the prior-art current driving circuit shown in FIG. 1(b), while FIG. 4 is an operating time chart of the circuit in FIG. 3.

In a first state ($Q_1$, $Q_4$ "on") illustrated in FIG. 4, transistors 3 and 6 are turned "on" by signals $G_1$ and $G_4$, and transistors 4 and 5 are turned "off" by signals $G_2$ and $G_3$, respectively. Then, the current $I_S$ of a current source 8 is drawn in the order of a terminal 9, the transistor 3, the load (head) 7 and the transistor 6 and flows to a terminal 17. On the other hand, in a second state ($Q_1$, $Q_4$ "off"), the current $I_S$ is drawn in the order of the terminal 9, the transistor 4, the load 7 and the transistor 5, and the current which flows through the load becomes the opposite sense. These operations are repeatedly performed according to the signals $G_1$–$G_4$, to form a current $I_L$ changing in inverted fashion. With this circuit, however, the two terminals are required per load. Further, in a case where the load 7 is inductive, the flyback voltage across the load 7 (the amplitude $|V_F|$ of a potential $V_F$ in FIG. 4) becomes great in changing the sense of the current, and hence, the switching of the transistors 3, 4 becomes difficult. Herein, in order to effect the switching operations of the transistors 3, 4 at high speed without being influenced by the flyback voltage $|V_F|$, the potentials of terminals 10 and 11 need to be higher than those of terminals 14 and 15 in excess of $|V_F|$ during "on" of the transistors 3, 4 so as to prevent the transistors 6, 5 from being saturated with the flyback voltage $|V_F|$, while they need to be lower than the lowest potential of $V_F$ during "off" of the transistors 3, 4. Here, the flyback voltage $|V_F|$ becomes $|V_F|=5.0$ V when a current of 100 mA is to be changedover through a load of 1 $\mu$H at high-speed switching of 20 nsec by way of example. In case of controlling the transistors 3, 4 by driving the terminals 10, 11 with such large amplitude, enhancement in the operating speed especially during the "off" state of the transistors 3, 4 is difficult, and disadvantageously the changing speed of the load current $I_L$ is limited in this part.

SUMMARY OF THE INVENTION

An object of the present invention is to improve such problems, and to provide a current driving circuit which drives current on only one side of a load, whereby the number of terminals to be led out from the load can be reduced, a load current can be inverted at high speed, and reliability can be enhanced owing to the simplification of the assembling process of the device.

The current driving circuit of the present invention for accomplishing such objects consists in a current driving circuit which supplies a two-terminal load with current to be inverted in accordance with input information, characterized by comprising the load whose one-side terminal has its potential fixed, means to supply a non-fixed side terminal of the load with a direct current, and means to supply the non-fixed side terminal with a current double in magnitude and opposite in polarity with respect to the direct current, while switching it in accordance with the input information.

BRIEF DESCRIPTION OF THE DRAWINGS

FIGS. 1(a) and 1(b) are schematic diagrams of prior-art current driving circuits for magnetic tape heads;

FIG. 2 is a diagram of an array of lead-out terminals for multitrack heads;

FIG. 3 is a fundamental arrangement diagram of the prior-art current driving circuit in FIG. 1(b);

FIG. 4 is an operating time chart of the circuit in FIG. 3;

FIG. 5 is a connection diagram showing the fundamental arrangement of the present invention;

FIG. 6 is a waveform diagram of currents which flow through a load in FIG. 5;

DESCRIPTION OF THE PREFERRED EMBODIMENTS

Figure 7:
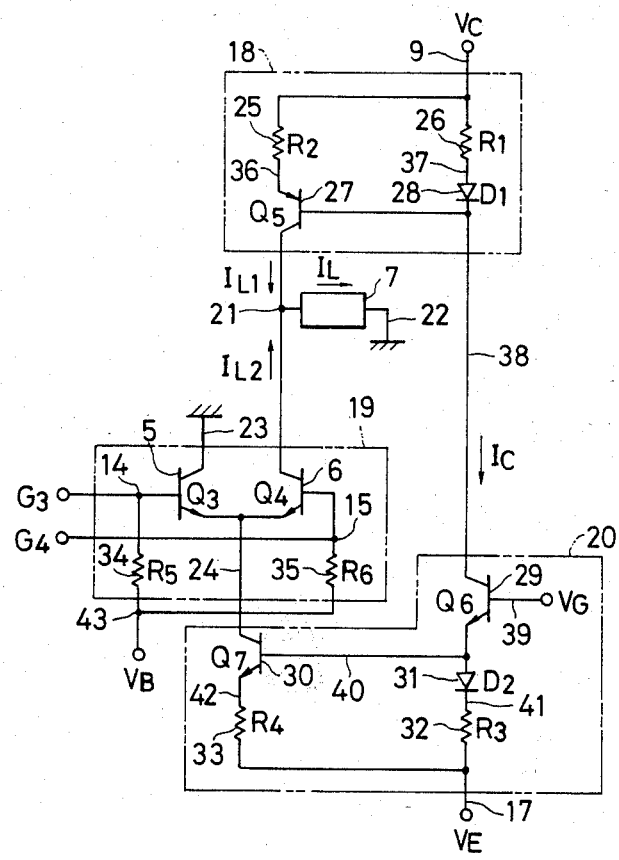
FIG. 7 is an arrangement diagram of a current driving circuit showing an embodiment of the present invention.

FIG. 5 is a connection diagram showing the fundamental arrangement of the present invention, while FIG. 6 is a waveform diagram of currents which flow through a load in FIG. 5.

In the present invention, as illustrated in FIG. 5, the potential of the one-side terminal 22 of a load 7 is fixed to $V_L$. A direct current $I_{L1}$ is caused to flow to the non-fixed side terminal 21 of the load 7, while at the same time a current $I_{L2}$ with a current $I_{S2}$ ($=-2I_{L1}$) switched by terminals 14 and 15 is caused to flow to the non-fixed side terminal 21, so as to form a load current $I_L$. Owing to such arrangement, the one-side terminals of the loads 7 can be made common. Further, the part for current switching by the signals $G_1$ and $G_2$, which has heretofore hindered the enhancement of the speed, is dispensed with to realize a current driving circuit of high speed. Means 18 to supply the current $I_{L1}$ in FIG. 6 generates a current $I_{S1}$ ($=I_{L1}$), while means 19 to supply the current $I_{L2}$ generates this current $I_{L2}$ by switching the current $I_{S2}=-2I_{L1}$ As illustrated in FIG. 6, the current $I_L=I_{L1}+I_{L2}$ holds. $V_C$ denotes a supply voltage to be connected to the collector of a transistor, and $V_E$ a supply voltage to be connected to the emitter.

FIG. 7 is an arrangement diagram of a current driving circuit showing an embodiment of the present invention.

FIG. 7 corresponds to a case where the invention is applied to the recording current driving circuit of a head in a digital magnetic storage device, for example, a magnetic tape storage device, and where a load 7 is the recording head.

The embodiment is constructed of the load 7 whose one-side terminal is grounded, a current source 18 which is composed of elements 25-28 to feed $I_{L1}$, a current source 20 (composed of elements 29-33) which determines the magnitude of $I_L$, and a current switch 19 which is composed of elements 5, 6, 34 and 35.

The resistor, diode and transistor (26, 28, 27) and those (32, 31, 30) in the current sources 18 and 20 constitute constant-current source circuits, respectively, which determine current values by means of the resistors 25 and 33. In addition, the transistors 5 and 6 in the current switch 19 constitute a CML (current-mode logic) in which either is turned "on" by an input $G_3$ or $G_4$. Further, the transistor 29 in the current source 20 alters the value of the recording current $I_L$ to flow through the head 7, depending upon the kind of a magnetic tape, and it sets the current value in accordance with an input $V_G$.

When, under the condition that the base-emitter voltage of the transistor 29 and the terminal voltage of the diode 31 are set at 1.6 (V), the input potential $V_G$ of a terminal 39 is made greater than $V_E+1.6$ (V), a current $I_C$ determined by the resistor 32 ($\approx(V_G-V_E-1.6)/R_3$) flows. The current $I_C$ also flows through the diode 28 and the resistor 26. Therefore, when the diodes 28 and 31 and the resistors 26 and 32 have the same ratings, the potential difference across terminals 40 and 17 equalizes to that across terminals 9 and 38. At this time, the relationship between the value $R_2$ of the resistor 25 of the current source 18 and the value $R_4$ of the resistor 33 of the current source 20 is held at $R_2=2\times R_4$, whereby the magnitude of the output current $I_{L1}$ of the transistor 27 becomes $\frac{1}{2}$ of the magnitude of the output current $I_{L2}$ of the transistor 30.

Besides the current $I_{L1}$, a current $I_{L2}$ flows through the recording head 7, this current being obtained in such a way that the current $I_{L2}$ double the current $I_{L1}$ in magnitude is repeatedly switched according to the inut signals $G_3$ and $G_4$. Thus, the recording current $I_L$ is formed.

In the embodiment of FIG. 7, a D.C. bias current can also be superposed on the recording current $I_L$ by varying the ratio ($R_1:R_3$) of the resistors 26 and 32 or the ratio ($R_2:R_4$) of the resistors 25 and 33.

Figure 8:
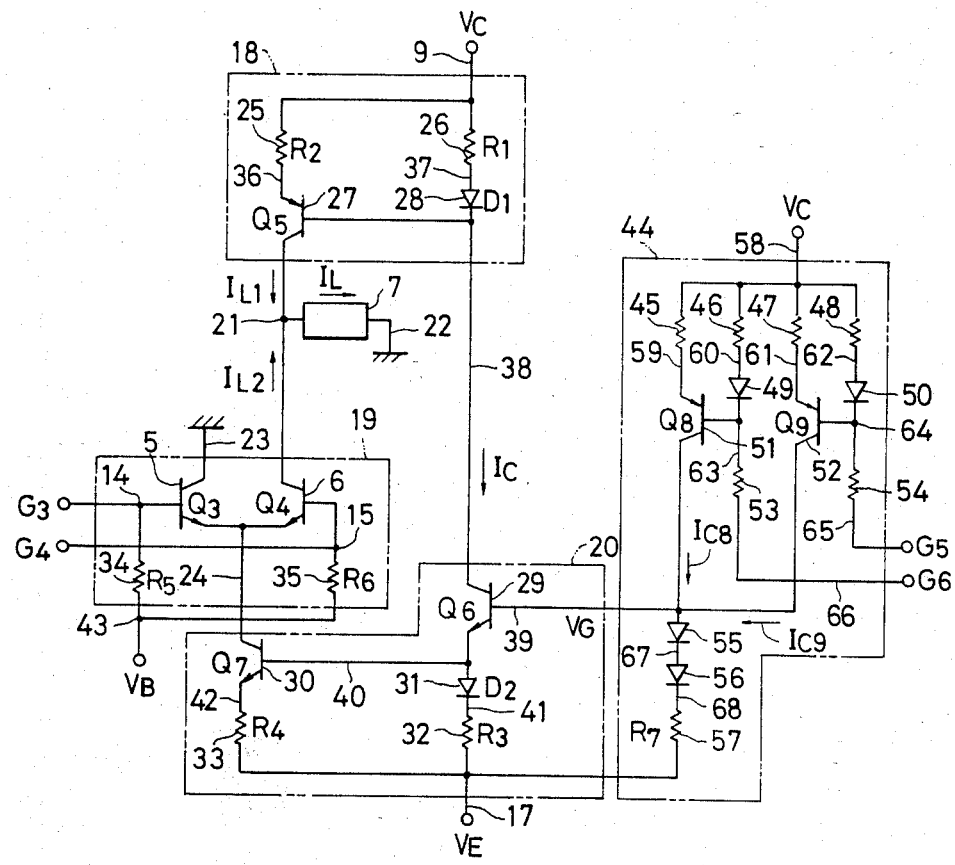
FIG. 8 is a diagram of an arrangement in which a current value switching portion is connected to the current driving circuit in FIG. 7.

FIG. 8 is a diagram of an arrangement in which a current value switching portion is connected to the current driving circuit of FIG. 7.

In the magnetic tape storage device, the magnitude of the recording current $I_L$ needs to be changed depending upon the kind of the magnetic tape being used for recording.

In FIG. 8, the potential difference $V_{GE}$ between the terminal 17 (potential $V_E$) and the node 39 (potential $V_G$) is controlled by switching gate signals $G_5$ and $G_6$, so as to change the magnitude of the recording current $I_L$.

The circuit of the recording current value-switching portion 44 is a digital-to-analog converter circuit whose digital signal inputs are the gate signals $G_5$ and $G_6$. Two constant current sources composed of a resistor, a diode and a transistor (46, 49, 51) and those (48, 50, 52) are connected to the base of the transistor 29 in parallel.

In this case, when both the signals $G_5$ and $G_6$ are open, that is, both are at an "H" (high) level, the potentials of nodes 63 and 64 equalize to the potential $V_C$ of a terminal 58. Therefore, the PNP transistors 51 and 52 do not turn "on", and no collector current flows. Accordingly, the aforementioned potential difference $V_{GE}$ becomes null, so that the collector current $I_C$ of the NPN transistor 29 does not flow, and the recording current $I_L$ becomes null. On the other hand, when the gate signal $G_5$ is closed and grounded to become an "L" (low) level, the potential of the base 64 of the transistor 52 is determined by the resistor 48 and the diode 50, and a collector current $I_{C9}$ determined by a resistor 47 flows to a resistor 57 via diodes 55 and 56. At this time, owing to the current flowing through the resistor 57, the potential difference $V_{GE}$ becomes $V_{GE}>1.6$ (V). As a result, the recording current $I_L$ of the magnitude corresponding to the potential difference $V_{GE}$ flows to the recording head 7 as explained with reference to FIG. 7.

This holds also in a case where only the gate signal $G_6$ is closed, and a collector current $I_{C8}$ determined by a resistor 45 flows from the transistor 51 to the resistor 57. Further, in a case where both the gate signals $G_5$ and $G_6$ are closed, the sum of the collector currents $I_{C8}$ and $I_{C9}$ flows to the resistor 57. Thus, by way of example, when the resistance values of the resistors 46 and 48 and resistors 53 and 54 are respectively equalized and the resistance value of the resistor 47 is rendered double that of the resistor 45, current values of 0, 1, 2 and 3 times as based on the recording current value at the closure of only the gate signal $G_5$ can be selected by the combinations of the opening and closure of the gate signals $G_5$ and $G_6$.

While, in FIGS. 7 and 8, the transistors 27, 51 and 52 are PNP transistors and those 5, 6, 29 and 30 are NPN transistors, the circuit can of course be realized even when the former transistors are NPN transistors and the latter transistors are PNP transistors.

In this case, the polarities of the diodes are also reversed with respect to PN. Needless to say, although the bipolar transistors are employed, MOSFETs are also usable.

As set forth above, according to the present invention, the potential of a terminal on one side of a load can be fixed. Therefore, when the invention is applied to thin film heads for multitrack recording, the one-side terminals of the plurality of heads can be connected in common, and the number of terminals to be led out from the heads can be reduced to about ½ as compared with that in the prior-art arrangement. Accordingly, owing to the simplification of an assembling process, enhancement in reliability can be achieved, and a higher density of integration is facilitated. Furthermore, since a current switching portion requiring a control signal of large amplitude is dispensed with, a high speed operation is possible even for an inductive load.

We claim:

1. In a current driving circuit which supplies a two-terminal load with current to be inverted in accordance with input information; a current driving circuit characterized by comprising a load whose one-side terminal has its potential fixed to a predetermined value, first means to supply a non-fixed side terminal of said load with a direct current, and second means to supply said non-fixed side terminal with a current having a value double that of the direct current and a polarity opposite to that of said direct current, while switching it in accordance with input information.

2. A current driving circuit according to claim 1, wherein said one-side terminal is grounded.

3. A current driving circuit according to claim 2, further comprising current value switching means for changing the value of the direct current supplied by said first means and controlling the current supplied by said second means to be double the value of said direct current supplied by said first means.

4. A current driving circuit according to claim 2, wherein said second means comprises a current switching circuit including two switching means either of which turns "on" in accordance with the input information.

5. A current driving circuit according to claim 1, further comprising current value switching means for changing the value of the direct current supplied by said first means and controlling the current supplied by said second means to be double the value of said direct current supplied by said first means.

6. A current driving circuit according to claim 1, wherein said second means comprises a current switching circuit including two switching means either of which turns "on" in accordance with the input information.

7. In a current driving circuit which supplies a two-terminal load with current to be inverted in accordance with input information; a current driving circuit characterized by comprising a load whose one-side terminal has its potential fixed to a predetermined value, first means to supply a non-fixed side terminal of said load with a direct current, and second means including two switching means either of which turns "on" in accordance with said input information, wherein said second means supplies said non-fixed side terminal with a current having a value double that of the direct current and a polarity opposite to that of said direct current when a predetermined one of said two switching means is "on" but not when the other of said two switching means is "on", and current value switching means for changing the value of the direct current supplied by said first means and controlling the current supplied by said second means to be said double value of said direct current supplied by said first means.

8. A current driving circuit according to claim 7, wherein said one-side terminal is grounded.

9. A current driving circuit according to claim 8, wherein said current value switching means includes two constant-current source circuits.

10. A current driving circuit according to claim 9, wherein said constant-current source circuits each include a resistor, a diode, and a transistor, wherein said resistor is coupled to said diode in series, said diode is coupled to the base of said transistor, and the emitter of said transistor is coupled to a voltage source.

11. A current driving circuit according to claim 8, wherein said two switching means includes two transistors having bases which receive said input information and emitters connected together.

12. A current driving circuit according to claim 7, wherein said current value switching means includes two constant-current source circuits.

13. A current driving circuit according to claim 12, wherein said constant-current source circuits each include a resistor, a diode and a transistor, wherein said resistor is coupled to said diode in series, said diode is coupled to the base of said transistor, and the emitter of said transistor is coupled to a voltage source.

14. A current driving circuit according to claim 7, wherein said two switching means includes two transistors having bases which receive said input information and emitters connected together.

15. A current driving circuit according to claim 7, wherein said first means includes a resistor, a diode and a transistor, wherein said resistor is coupled to said diode in series, said diode is coupled to the base of said transistor, and the emitter of said transistor is coupled to a voltage source.

16. A current driving circuit according to claim 7, wherein said second means further includes a constant-current source circuit.

17. A current driving circuit according to claim 16, wherein said constant-current source circuit of said second means and said current value switching means are connected through a transistor.

* * * * *